(12) United States Patent
Tamagaki et al.

(10) Patent No.: US 9,399,577 B2
(45) Date of Patent: Jul. 26, 2016

(54) METHOD FOR PRODUCING WATER-RESISTANT ALUMINUM NITRIDE POWDER

(71) Applicant: TOKUYAMA CORPORATION, Yamaguchi (JP)

(72) Inventors: Megumu Tamagaki, Yamaguchi (JP); Yukihiro Kanechika, Yamaguchi (JP)

(73) Assignee: TOKUYAMA CORPORATION, Shunan-shi, Yamaguchi (JP)

(*) Notice: Subject to any disclaimer, the term of this patent is extended or adjusted under 35 U.S.C. 154(b) by 0 days.

(21) Appl. No.: 14/423,522

(22) PCT Filed: Sep. 6, 2013

(86) PCT No.: PCT/JP2013/074150
§ 371 (c)(1),
(2) Date: Feb. 24, 2015

(87) PCT Pub. No.: WO2014/038676
PCT Pub. Date: Mar. 13, 2014

(65) Prior Publication Data
US 2015/0225238 A1   Aug. 13, 2015

(30) Foreign Application Priority Data
Sep. 7, 2012   (JP) ................................. 2012-197362

(51) Int. Cl.
*H01L 23/373*   (2006.01)
*C01B 21/072*   (2006.01)

(52) U.S. Cl.
CPC ......... *C01B 21/0728* (2013.01); *C01P 2002/72* (2013.01); *C01P 2004/03* (2013.01);
(Continued)

(58) Field of Classification Search
None
See application file for complete search history.

(56) References Cited

U.S. PATENT DOCUMENTS 4,923,689 A * 5/1990 Uenishi et al. ................ 423/267
5,126,121 A * 6/1992 Weimer ............... C01B 21/0722
423/412

(Continued)

FOREIGN PATENT DOCUMENTS

DE   3925338 A1   2/1990
EP   2650259 A1   10/2013

(Continued)

OTHER PUBLICATIONS

International Search Report dated Oct. 8, 2013; PCT/JP2013/074150.

*Primary Examiner* — Guinever S Gregorio
(74) *Attorney, Agent, or Firm* — Ladas & Parry LLP

(57) ABSTRACT

Provided is a method for producing a water-resistant aluminum nitride powder capable of adding a good water-resistant property to an aluminum nitride powder wherein yttria exists on a particle surface. The method is for producing a water-resistant aluminum nitride powder by carrying out a treatment to a particle surface of an aluminum nitride powder, the method including the successive steps of (i) making an aluminum nitride powder contact with an acid solution wherein yttria exists at least on a particle surface of the aluminum nitride powder; and (ii) making the aluminum nitride powder contact with a phosphorous acid compound, wherein the amount of yttria which is extracted when the aluminum nitride powder is filtered, washed with water, and dried after the step (i) and is thereafter subjected to extraction with 1 mol/L hydrochloric acid is no more than 1000 mg per 100 g of the aluminum nitride powder.

8 Claims, 4 Drawing Sheets

(52) U.S. Cl.
CPC ......... *C01P2004/61* (2013.01); *C01P 2006/12* (2013.01); *C01P 2006/80* (2013.01); *C01P 2006/90* (2013.01); *H01L 23/3733* (2013.01); *H01L 23/3737* (2013.01); *H01L 2924/0002* (2013.01)

(56) References Cited

U.S. PATENT DOCUMENTS

| | | | | |
|---|---|---|---|---|
| 5,646,078 A | * | 7/1997 | Mohri | C01B 21/072 423/412 |
| 5,710,382 A | * | 1/1998 | Dunmead | C01B 21/072 428/550 |
| 5,767,028 A | * | 6/1998 | Komatsu | C04B 35/581 257/E23.009 |
| 6,271,163 B1 | * | 8/2001 | Yushio | C04B 35/581 257/E23.009 |
| 6,482,384 B1 | * | 11/2002 | Chung | C01B 21/0722 423/412 |
| 2012/0258310 A1 | * | 10/2012 | Watanabe | C01B 21/072 428/402 |
| 2013/0171451 A1 | * | 7/2013 | Muneoka | C01B 21/0726 428/402 |
| 2013/0244036 A1 | * | 9/2013 | Muneoka | C01B 21/0726 428/402 |
| 2014/0042675 A1 | * | 2/2014 | Chung | C01B 21/0728 264/670 |
| 2014/0061530 A1 | | 3/2014 | Ohno et al. | |

FOREIGN PATENT DOCUMENTS

| | | |
|---|---|---|
| JP | 62-143806 A | 6/1987 |
| JP | 2002-179413 A | 6/2002 |
| JP | 2002-226207 A | 8/2002 |
| JP | 2004-083334 A | 3/2004 |
| JP | 2004-217441 A | 8/2004 |
| WO | 2012/043574 A1 | 4/2012 |
| WO | 2012077551 A1 | 6/2012 |
| WO | 2012/147999 A1 | 11/2012 |

* cited by examiner

METHOD FOR PRODUCING WATER-RESISTANT ALUMINUM NITRIDE POWDER

BACKGROUND OF THE INVENTION

1. Field of the Invention

The present invention relates to a new method for producing a water-resistant aluminum nitride powder.

2. Description of the Related Art

Aluminum nitride has a good thermal conductivity and electric insulation property. As a method for producing an aluminum nitride powder suitable for a heat radiation filler, Patent Document 1 discloses a method of firing a powder mixture of an alumina or an alumina hydrate, a carbon powder, and a rare earth metal compound at a predetermined temperature in an atmosphere including nitrogen, to progress reductive nitriding of the alumina (or the alumina hydrate).

According to the producing method of Patent Document 1, it is possible to increase the particle size of the aluminum nitride powder to be produced by using the rare earth metal compound (co-melting agent), to thereby obtain an aluminum nitride particle formed in a substantially spherical shape having a size useful as a filler.

On the other hand, aluminum nitride is easily hydrolyzed. Aluminum nitride loses its good property due to generation of aluminum hydroxide by hydrolysis, and a problem on handling, a problem of corrosion and the like occur due to generation of ammonia.

In this regard, in order to add a water-resistant property to the aluminum nitride powder, various methods have been suggested such as phosphorus acid compound treatment of making the aluminum nitride powder contact with a phosphorus acid compound (Patent Documents 2, 3), and silane coupling treatment (Patent Document 4).

CITATION LIST

Patent Literatures

Patent Document 1: WO 2012/043574 A1
Patent Document 2: JP 2002-226207 A
Patent Document 3: WO 2012/147999 A1
Patent Document 4: JP 2004-083334 A

SUMMARY OF THE INVENTION

Problems to be Solved by the Invention

However, the inventors of the present invention have found that: in a case where yttria is used as the rare earth metal compound (co-melting agent) in the producing method of Patent Document 1, it is not possible to render an enough water-resistant property to the obtained aluminum nitride powder even by a treatment with a phosphorus acid compound. As a result of a further study, the inventors have found that yttrium exists in a form of yttria, which is an oxide of yttrium, on a surface of the aluminum nitride powder obtained in a case where yttria is used as the co-melting agent in the producing method of Patent Document 1.

An object of the present invention is to provide a method for producing a water-resistant aluminum nitride powder capable of rendering a good water-resistant property to an aluminum nitride powder having yttria on its particle surface.

Means for Solving the Problems

As a result of an examination, the inventors have found out that: it is possible to effectively remove yttria existing on a particle surface of the aluminum nitride powder by an acid solution; and it is possible to add a good water-resistant property to the aluminum nitride powder by carrying out a water resistance treatment by a phosphorus compound, after sufficiently reducing the yttria existing on the particle surface. The present invention has been made based on the above findings.

The present invention provides a method for producing a water-resistant aluminum nitride powder by surface treatment of aluminum nitride powder particles, the method including the successive steps of:

(i) making an aluminum nitride powder contact with an acid solution, wherein yttria exists at least on a particle surface of the aluminum nitride powder; and (ii) making the aluminum nitride powder contact with a phosphorus acid compound, wherein the amount of yttria which is extracted when the aluminum nitride powder is filtered, washed with water, and dried after the step (i) and is thereafter subjected to extraction with 1 mol/L hydrochloric acid is no more than 1000 mg per 100 g of the aluminum nitride powder filtered, washed with water, and dried.

Here, regarding the aluminum nitride powder, it can be confirmed that "yttria exists at least on a particle surface", by (A) when a particle of the aluminum nitride powder is observed by means of a scanning electron microscope (acceleration voltage: 1.0 kV, reflected electron detecting mode), observing a portion having a higher contrast (appearing whiter) than that of the other portion on the particle surface, and (B) observing the existence of yttria by means of powder X-ray diffraction of the aluminum nitride powder. The existence of yttria by means of powder X-ray diffraction can be confirmed by observing a peak at a position of $2\theta=29°$.

The determination of the amount of extracted yttria includes the successive steps of:

(a) adding 10 g of the aluminum nitride powder filtered, washed with water, and dried to 25 mL of 1 mol/L hydrochloric acid in a 50 mL vial bottle at 25° C.;

(b) holding the vial bottle in a ultrasonic bath and sonicating the vial bottle at 43 kHz for 30 minutes at 25° C.;

(c) filtering the content of the vial bottle and thereby obtaining a filtrate;

(d) measuring yttrium content in the filtrate by means of inductively coupled plasma atomic emission spectrometry; and (e) converting the yttrium content in the filtrate into the content in terms of yttria. Here, as the ultrasonic bath used in the step (b), a Bransonic table top ultrasonic cleaner (tank size: width 295 mm×depth 150 mm×height 150 mm, tank capacity: 6.0 L, ultrasonic output: 120 W) manufactured by Branson Ultrasonics Corporation is preferably employed. Also, as the depth to hold the vial bottle in the ultrasonic bath, a depth with which the distance from the outer surface of the bottom portion of the vial bottle to the water surface of the ultrasonic bath is 40 mm is preferably employed. It should be noted that the vial bottle is made of glass.

In the present application, the term "phosphorus acid compound" encompasses all acidic phosphorus compounds having a group represented by the following general Formula (1) and salts thereof.

[Chemical Formula 1]

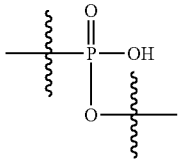
(1)

As the aluminum nitride powder of the raw material in the present invention, an aluminum nitride powder having an average particle size preferably of 1 to 30 μm, more preferably of 3 to 30 μm can be suitably employed.

In the present application, the term "average particle size" means an equivalent spherical size (diameter) corresponding to an intermediate value of a particle size distribution (volume distribution) measured by means of laser diffraction scattering method. The measurement of the particle size distribution by laser diffraction scattering method can be carried out by means of a commercially-available laser diffraction scattering type particle size distribution measuring apparatus (e.g. MT3300, manufactured by NIKKISO CO., LTD.).

Preferably, the solvent of the acid solution in the above step (i) is water, and the acid solution has pH of 4 or less. More preferably, the acid solution has pH of 3 or less.

Preferably, the phosphorus acid compound in the above step (ii) is one or more compounds selected from the group consisting of: inorganic phosphoric acids, metal salts thereof, and organic phosphorus acid having an organic group.

In the present application, the term "inorganic phosphoric acid" or simply "phosphoric acid" includes not only orthophosphate $H_3PO_4$, but also pyrophosphate $H_4P_2O_7$, more highly condensed phosphate $H_{n+2}P_nO_{3n+1}$, and metaphosphate (polyphosphate) $(HPO_3)_n$. Also, in the present application, the term "organic phosphorus acid" means an organic phosphorus compound acid having an organic group, including not only an incomplete ester of phosphoric acid, but also phosphonic acid and an incomplete ester thereof.

Preferably, in the above step (ii), mass of deposit of the phosphorus acid compound per unit surface area of the aluminum nitride powder is 0.5 to 50 mg/m² in terms of orthophosphate ion ($PO_4^{3-}$), and more preferably 1 to 10 mg/m².

Here, the mass of deposit of the phosphorus acid compound to the aluminum nitride powder is calculated by a formula (X—Y), wherein X is the amount of phosphorus acid compound used in the above step (ii), and Y is the amount of phosphorus acid compound which did not deposit to the aluminum nitride powder. For example, in a case where the water-resistant aluminum nitride powder is obtained by: carrying out the step (ii) by dispersing the aluminum nitride particle in a phosphorus acid compound solution; thereafter evaporating to dry and solidify the obtained mixture without having any solid/liquid separation treatment (e.g. filtration, decantation), X is the amount of phosphorus acid compound included in the phosphorus acid compound solution, and Y=0. Also, for example in a case where the water-resistant aluminum nitride powder is obtained by: carrying out the step (ii) by dispersing the aluminum nitride particle in a phosphorus acid compound solution; thereafter filtering and drying the aluminum nitride particle, X is the amount of phosphorus acid compound included in the phosphorus acid compound solution, and Y is the amount of phosphorus acid compound included in the filtrate. In converting the mass of deposit of the phosphorus acid compound to an amount of orthophosphate ion ($PO_4^{3-}$), 1 mol of phosphorus atom of phosphorus acid compound corresponds to 1 mol of orthophosphate ion ($PO_4^{3-}$). The "mass of deposit of the phosphorus acid compound per unit surface area of the aluminum nitride powder" is calculated by a formula (Z/S), wherein S is the specific surface area of the aluminum nitride powder obtained by means of BET method, and Z is the mass of deposit of phosphorus acid compound converted to an amount of orthophosphate ion.

Effects of the Invention

The method for producing a water-resistant aluminum nitride powder of the present invention makes it possible to render a good water-resistant property to an aluminum nitride powder wherein yttrium exists on the particle surface in a form of an oxide.

DETAILED DESCRIPTION OF THE INVENTION

Figure 1:
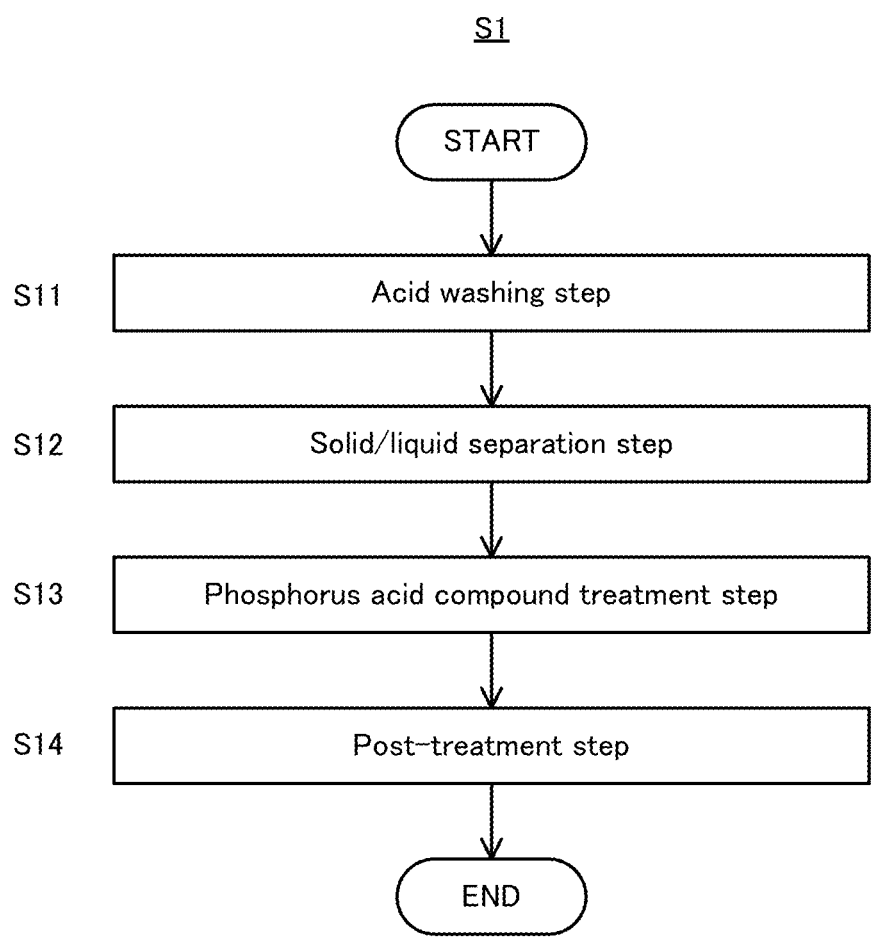
FIG. 1 is a flowchart to explain a producing method of a water-resistant aluminum nitride powder according to one embodiment of the present invention.

Hereinafter embodiments of the present invention will be described referring to the drawings. It should be noted that, the embodiments shown below are examples of the present invention, and the present invention is not limited to these embodiments. Also, unless otherwise mentioned, "A to B" regarding numerical values A and B means "A or more and B or less". In cases where the unit of the numerical value A is omitted, the unit given to the numerical value B is applied as the unit of the numerical value A.

FIG. 1 is a flowchart to explain a producing method S1 (hereinafter sometimes simply referred to as "producing method S1") of a water-resistant aluminum nitride powder according to one embodiment of the present invention. As shown in FIG. 1, the producing method S1 includes an acid washing step S11, a solid/liquid separation step S12, a phosphorus acid compound treatment step S13, and a post-treatment step S14, in the order mentioned. Hereinafter each step is described in order.

<Acid Washing Step S1>

The acid washing step S1 (hereinafter may be referred to as "S1" for short) is a step of making an aluminum nitride powder contact with an acid solution, wherein yttria exists at least on a particle surface of the aluminum nitride powder. It is possible to make the aluminum nitride powder contact with an acid solution in the acid washing step S1, for example by means of dispersing the aluminum nitride powder in the acid solution, by means of mixing a slurry in which the aluminum nitride powder is dispersed in a solvent (e.g. water) and the acid solution and the like.

(Aluminum Nitride Powder)

In the present invention, the aluminum nitride powder to be a raw material is not particularly limited as long as yttria exists on a particle surface of the aluminum nitride powder.

Here, the expression "yttria exists on a particle surface" includes all states in which yttria exists on a particle surface of the aluminum nitride powder. Examples of such states include: a state in which a part or the whole of the particle of the aluminum nitride powder is covered by a layer including yttria; a state in which a particle of yttria is adhered to the particle surface of the aluminum nitride powder; a state in which the particle of the aluminum nitride powder is formed by an aluminum nitride crystal particle sintered via the grain boundary phase, and the grain boundary phase includes yttria.

The aluminum nitride powder wherein yttria exists on the particle surface may be obtained by any method. For example, the powder can be obtained by means of a direct nitriding method, a reductive nitriding method, a vapor phase synthetic method and the like that are conventionally known producing methods, or can be obtained by forming and firing an aluminum nitride powder.

Among them, as a suitable aluminum nitride powder in the present invention, as described in Patent Document 1, an aluminum nitride powder obtained by firing a powder mixture of an alumina or an alumina hydrate, a carbon powder, and yttria in a nitrogen atmosphere to reductively nitride the alumina (or the alumina hydrate) can be given.

specifically, an aluminum nitride powder obtained by: mixing 100 parts by mass of an alumina or an alumina hydrate, 0.5 to 30 parts by mass of yttria, and 38 to 46 parts by mass of a carbon powder; and holding the obtained mixture in a nitrogen atmosphere at a temperature of 1620 to 1900° C. for no less than 2 hours, to thereby reductively nitride the alumina or the alumina hydrate can be raised as an example. The aluminum nitride powder produced as described is, as a result of the producing method, in a state in which a part or the whole of the particle surface is covered by a layer including yttria.

The particle size of the aluminum nitride powder to be the raw material can be determined depending on the purpose of use, and is not particularly limited. The average particle size (equivalent spherical size corresponding to median of the volume distribution measured by laser diffraction scattering method) of the aluminum nitride powder to be the raw material is normally 0.1 to 500 μm, preferably 1 to 100 μm, more preferably 1 to 30 μm, further preferably 3 to 30 μm. The shape of the powder is not particularly limited either, and can be in an undefined shape, spherical shape and the like. Preferably the shape of the powder is a spherical shape.

(Acid Solution)

In the acid washing step S1, as the acid solution to contact with the aluminum nitride powder, a known acid solution which can dissolve yttria can be used, and water is preferably used as the solvent. As the acid, an acid other than phosphorus acid compound which is described later is used. Specifically, strong acids such as hydrogen chloride, nitric acid, sulfuric acid, perchloric acid, hydrogen iodide, hydrogen bromide, permanganic acid, thiocyanic acid are suitably employed.

The concentration of the acid solution is not particularly limited, and preferably no less than 0.1 mol/L, more preferably no less than 1 mol/L. If the concentration of the acid solution is too low, it is difficult to dissolve yttria. In a case where the contacting of the aluminum nitride powder and the acid solution is carried out by means of mixing the acid solution and a slurry in which the aluminum nitride particle is dispersed in a solvent, it is preferable that the concentration after the acid solution is diluted by the solvent included in the slurry is in the above range. In a case where the solvent of the acid solution is water, the acid solution preferably has pH of 4 or less, and more preferably has pH of 3 or less.

(Treatment Condition)

The temperature in contacting the aluminum nitride powder and the acid solution is not particularly limited, and normally 5 to 100° C., and preferably 20 to 40° C. Too low temperature makes the treatment inefficient since the solubility of yttria decreases, and too high temperature may promote hydrolysis of the aluminum nitride.

The concentration of the aluminum nitride powder (solid content) in making the aluminum nitride powder contact with the acid solution is not particularly limited, and preferably 10 to 50 mass %, more preferably 20 to 40 mass %, to the total amount of the mixture of the aluminum nitride powder and the acid solution. Too high concentration of the aluminum nitride powder makes it difficult to dissolve yttria, and too low concentration results in lower productivity.

The time to contact the aluminum nitride powder and the acid solution is, depending on the conditions such as temperature and concentration, normally for 5 minutes to 24 hours, preferably for 30 minutes to 2 hours. Too short contacting time may result in insufficient dissolution of yttira, and too long contacting time may allow hydrolysis of the aluminum nitride to proceed.

(Remaining Amount of Yttria)

The amount of yttria on the particle surface of the aluminum nitride powder after the acid washing step S1 is not limited, as long as it is reduced to an amount with which a surface treatment by the phosphorus acid compound described later is not interfered. The amount of yttria to be extracted in a case where the aluminum nitride powder filtered and dried after the acid washing step S1 is subjected to extraction with 1 mol/L hydrochloric acid is preferably no more than 1000 mg/100 g (aluminum nitride powder), more preferably no more than 250 mg/100 g (aluminum nitride powder).

Here, the above-described "amount of yttria to be extracted" is a value determined by the successive steps of the following (a) to (e):

(a) adding 10 g of the aluminum nitride powder filtered, washed with water, and dried to 25 mL of 1 mol/L hydrochloric acid in a 50 mL vial bottle at 25° C.;

(b) holding the vial bottle in a ultrasonic bath and sonicating the vial bottle at 43 kHz for 30 minutes at 25° C.;

(c) filtering the content of the vial bottle and thereby obtaining a filtrate;

(d) measuring yttrium content in the filtrate by means of inductively coupled plasma atomic emission spectrometry; and (e) converting the yttrium content in the filtrate into the content in terms of yttria.

The amount of yttria which is extracted when the aluminum nitride powder obtained by using yttria as the rare earth metal compound in the producing method of an aluminum nitride powder of Patent Document 1 is subjected to the above steps (a) to (e) is no less than 2000 mg/100 g (aluminum nitride powder).

<Solid/Liquid Separation Step S12>

The solid/liquid separation step S12 (hereinafter sometimes referred to as "S12" for short) is a step of separating the acid solution and the aluminum nitride powder after S11. As a specific method for the separation in S12, a filtration, a decantation, a centrifugal separation, a combination thereof and the like can be raised as examples. In S12, it is preferable to further subject the aluminum nitride powder separated from the acid solution to a washing treatment by means of water or the like, to remove acid from the aluminum nitride powder.

The aluminum nitride powder after having contact with the acid solution can be subjected to the latter steps, for example in a state of being dispersed in water, or in a state of including water after filtration. Also, the aluminum nitride powder can be subjected to the latter steps after being dried. However, it is preferable for the aluminum nitride powder to be subjected to the later steps (contacting treatment with phosphorus acid compound) with a state of including water, since it makes it possible to save the energy required for drying, and it realizes a good dispersion property of the aluminum nitride powder into a phosphorus acid compound solution.

<Phosphorus Acid Compound Treatment Step S13>

The phosphorus acid compound treatment step S13 (hereinafter sometimes referred to as "S13" for short) is a step of making the aluminum nitride powder after S12 contact with the phosphorus acid compound. As a method of contacting the aluminum nitride powder and the phosphorus acid compound in S13, a known method can be employed without particular limitations. For example, a method of dispersing the aluminum nitride powder into a phosphorus acid compound solution, a method of making a paste in which the aluminum nitride powder is kneaded in a phosphorus acid compound solution and the like can be given. In dispersing the aluminum nitride powder into a phosphorus acid compound solution, a known apparatus such as a disperser, a homogenizer, and an ultrasonic wave disperser can be used.

(Phosphorus Acid Compound)

As the phosphorus acid compound in S13, a known phosphorus acid compound used for water resistance treatment to the aluminum nitride powder can be used without particular limitations. Examples of the phosphorus acid compound which can be used in S13 include: inorganic phosphoric acids such as orthophosphoric acid, pyrophosphoric acid, and metaphosphoric acid; metal salts of inorganic phosphoric acid such as lithium phosphate, potassium phosphate, sodium phosphate, aluminum hydrogen phosphate, and aluminum dihydrogen phosphate; ammonium salts of inorganic phosphoric acid such as ammonium phosphate, ammonium hydrogen phosphate, and diammonium hydrogen phosphate; and organic phosphorus acid having an organic group. As a preferable organic phosphorus acid, an organic phosphorus acid represented by the following general Formula (2) can be given.

[Chemical Formula 2]

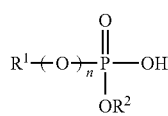

(2)

(in the formula (2), n is 0 or 1; $R^1$ is a hydrocarbon group having 1 to 12 carbon atoms; $R^2$ is a hydrocarbon group having 1 to 12 carbon atoms.)

Preferable examples of the organic phosphorus acid represented by the above general formula (2) include: incomplete esters of phosphoric acid such as methyl phosphoric acid (monomethyl phosphate, dimethyl phosphate, or a mixture thereof), ethyl phosphoric acid (monoethyl phosphate, diethyl phosphate, or a mixture thereof), propyl phosphoric acid (monopropyl phosphate, dipropyl phosphate, or a mixture thereof), butyl phosphoric acid (monobutyl phosphate, dibutyl phosphate, or a mixture thereof), pentyl phosphoric acid (monopentyl phosphate, dipentyl phosphate, or a mixture thereof), hexyl phosphoric acid (monohexyl phosphate, dihexyl phosphate, or a mixture thereof), octyl phosphoric acid (monooctyl phosphate, dioctyl phosphate, or a mixture thereof), dodecyl phosphoric acid (monododecyl phosphate, di(dodecyl) phosphate, or a mixture thereof); phosphonic acids such as methyl phosphonic acid, ethyl phosphonic acid, propyl phosphonic acid, butyl phosphonic acid, pentyl phosphonic acid, hexyl phosphonic acid, octyl phosphonic acid, vinyl phosphonic acid, and phenyl phosphonic acid. Phosphonic acids may be incompletely esterified.

Regarding the above-mentioned phosphorus acid compounds, one of them can be used alone, or two or more thereof can be used in combination. Among the above-mentioned phosphorus acid compounds, it is preferable to use one or more selected from the inorganic phosphoric acids, metal salts of the inorganic phosphoric acids, and organic phosphorus acids.

It is presumed that the above-mentioned phosphorus acid compounds render water-resistant property by having contact with the aluminum nitride powder, then reacting with aluminum on the surface to form aluminum phosphate bond (Al—O—P bond), to thereby cover the aluminum nitride powder with a layer of aluminum phosphate.

(Treatment Condition)

In S13, as the conditions in contacting the aluminum nitride powder and the phosphorus acid compound, known conditions can be employed without particular limitations. For example, the contacting time can be 1 to 120 minutes, and the temperature in contacting can be normally 0 to 90° C.

<Post-Treatment Step S14>

The post-treatment step S14 (hereinafter sometimes referred to as "S14" for short) is a step of taking out the water-resistant aluminum nitride powder from the mixture of the aluminum nitride powder and the phosphorus acid compound solution obtained in S13. As a specific mode of S14, for example (A) a mode of evaporating the solvent from the mixture to thereby dry and solidify the mixture; (B) a mode of filtering the aluminum nitride powder from the mixture and drying the filtered aluminum nitride powder; and (C) a mode of filtering the aluminum nitride powder from the mixture and washing the obtained powder by means of an adequate solvent (e.g. water), thereafter drying the obtained powder and the like can be given as examples.

In the post-treatment S14, the obtained water-resistant aluminum nitride powder can be further subjected to a heating treatment at a temperature of 100 to 1000° C. Such a heating treatment can further improve the water-resistant property of the water-resistant aluminum nitride powder.

In the above explanation regarding the present invention, the producing method S1 of a water-resistant aluminum nitride powder in which the aluminum nitride powder after the solid/liquid separation step S12 is directly subjected to the phosphorus acid compound treatment step S13. However, the present invention is not limited to this embodiment. For example, the producing method of a water-resistant aluminum nitride powder may include a treatment to improve the efficiency of the phosphorus acid compound treatment in S13, after the solid/liquid separation step S12 and before the phosphorus acid compound treatment step S13. Such an embodiment of the producing method of a water-resistant aluminum nitride powder will be described hereinafter.

Figure 2:
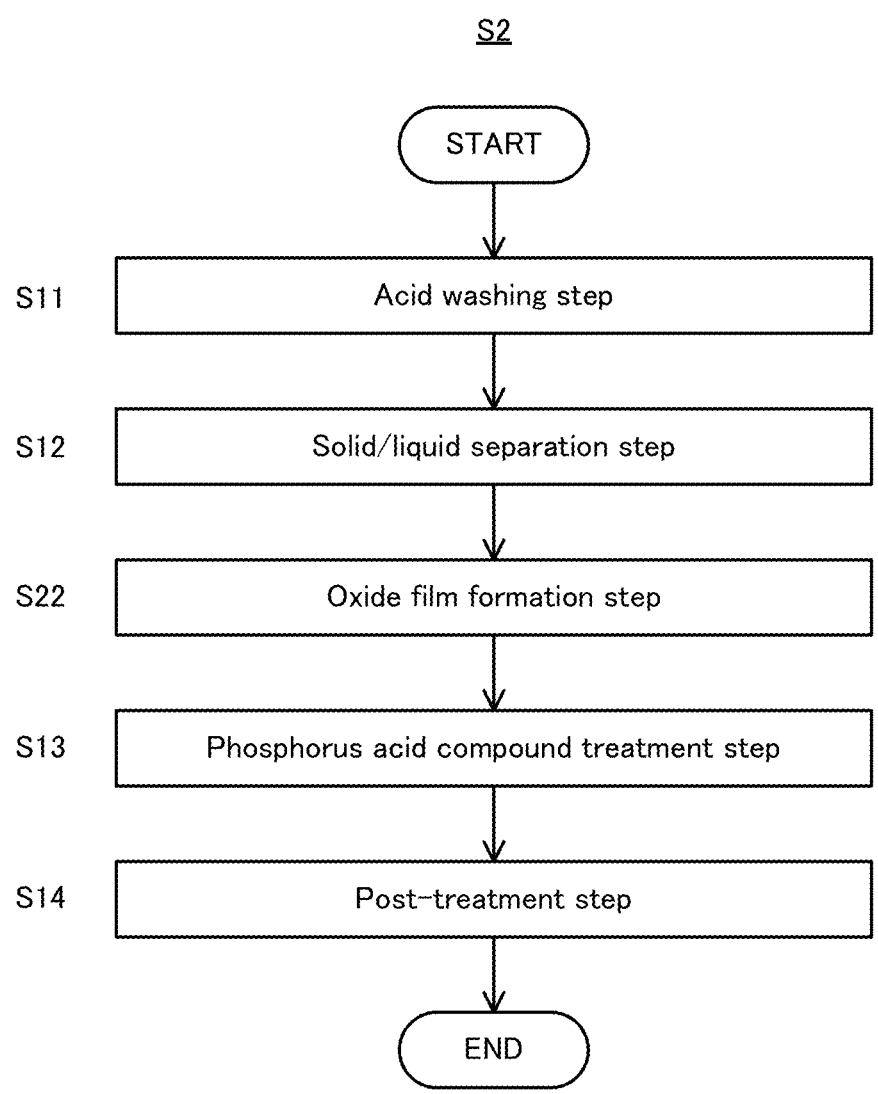
FIG. 2 is a flowchart to explain a producing method of a water-resistant aluminum nitride powder according to another embodiment of the present invention.

FIG. 2 is a flowchart to explain a producing method S2 (hereinafter sometimes referred to as "producing method S2") of a water-resistant aluminum nitride powder according to another embodiment of the present invention. As shown in FIG. 2, the producing method S2 includes the acid washing step S11, the solid/liquid separation step S12, an oxide film formation step S22, the phosphorus acid compound treatment step S13, and the post-treatment step S14 in the order mentioned. Each of the steps other than the oxide film formation step S22 is same as the step having the same name in the producing method S1.

<Oxide Film Formation Step S22>

The oxide film formation step S22 (hereinafter sometimes referred to as "S22" for short) is a step of forming an oxide film on the particle surface of the aluminum nitride powder wherein yttria on the particle surface is reduced by experiencing the acid washing step S11 and the solid/liquid separation step S12. Experiencing S22 makes it possible to improve reactivity with the phosphorus acid compound. As the method of forming the oxide film in S22, a known method for forming an oxide film can be employed. The amount of the oxide film to be formed in S22 is preferably an amount such that 0.001 to 0.1 $g/m^2$ of aluminum oxide exists per unit surface area (BET method) of the raw material aluminum nitride powder, in terms of oxygen. The amount of the oxide film on the particle surface of the aluminum nitride powder can be determined by: quantifying the oxygen concentration of the aluminum nitride powder by inert gas fusion-infrared absorption method, by means of helium gas as an inert gas, and an oxygen/nitrogen analyzer (e.g. product name: EMGA-620W, manufactured by HORIBA, Ltd.); then applying the oxygen concentration to the following formula.

Amount of oxide film=oxygen concentration (wt %)/
(BET specific surface area $(m^2/g) \times 100$)

<Application>

The aluminum nitride powder produced by the present invention can be widely used for various purposes making use of the property of the aluminum nitride, especially for a filler to be filled in a heat radiation material such as a heat radiation sheet, a heat radiation grease, a heat radiation adhesive, a paint, and a thermally conductive resin.

Here, examples of a matrix of the heat radiation material include a thermosetting resin such as an epoxy resin and a phenol resin, a thermoplastic resin such as polyethylene, polypropylene, polyamide, polycarbonate, polyimide, polyphenylene sulfide, rubbers such as silicone rubbers, EPR, and SBR, and silicone oil.

Among them, as the matrix of the heat radiation material, for example an epoxy resin and a silicon resin are preferable, and an addition reaction type liquid silicone rubber is desirable for making a highly flexible heat radiation member.

EXAMPLES

Hereinafter, the present invention will be further specifically described based on Examples and Comparative Examples. However, the present invention is not limited to these Examples.

In Examples, each measurement was carried out as follows.

(Average Particle Size)

The particle distribution (volume distribution) was measured by means of a laser diffraction scattering particle size distribution measuring apparatus (MT3300, manufactured by NIKKISO CO., LTD.), and a spherical size (diameter) corresponding to the median value of the particle size distribution was determined as the average particle size.

(Specific Surface Area)

The specific surface area was measured by means of BET one point method.

(Amount of Yttria Extracted by Means of Hydrochloric Acid)

The amount was determined by the following steps (a) to (f) carried out in the order mentioned:

(a) adding 10 g of the aluminum nitride powder filtered, washed with water, and dried after contacting with the acid solution to 25 mL of 1 mol/L hydrochloric acid in a 50 mL vial bottle (snap vial No. 7, manufactured by AS ONE Corporation, the main body is made of borosilicate glass) at 25° C.;

(b) holding the vial bottle immersed in water (5 L) in a ultrasonic bath (Bransonic table top ultrasonic cleaner, manufactured by Branson Ultrasonics Corporation, tank size: width 295 mm×depth 150 mm×height 150 mm, tank capacity: 6.0 L, ultrasonic output: 120 W) and sonicating the vial bottle at 43 kHz for 30 minutes at 25° C. The depth from the water surface to the outer surface of the bottom portion of the vial bottle was 40 mm;

(c) filtering the content of the vial bottle and thereby obtaining a filtrate;

(d) measuring yttrium content in the filtrate by means of inductively coupled plasma atomic emission spectrometry;

(e) converting the yttrium content in the filtrate into the content in terms of yttria;

(f) converting the converted yttria content into the value per 100 g of the above "aluminum nitride powder filtered, washed with water, and dried after contacting with the acid solution".

(Amount of Oxide Film)

The oxygen concentration of the aluminum nitride powder was quantified by inert gas fusion-infrared absorption method, by means of helium gas as the inert gas, and an oxygen/nitrogen analyzer (product name: EMGA-620W, manufactured by HORIBA, Ltd.). From the obtained oxygen concentration, the amount of the oxide film was calculated by means of the following formula.

Amount of oxide film=oxygen concentration (wt %)/
(BET specific surface area $(m^2/g) \times 100$)

(Water-Resistance Test)

The obtained water-resistant aluminum nitride powder after the phosphorus acid compound treatment step (2 g) was dispersed in 100 g of pure water at a room temperature, and pH of the dispersion was measured by means of pH paper. Thereafter, the dispersion was charged in a pressure vessel and heated to 120° C., then left for 24 hours. Thereafter the dispersion was cooled to room temperature by water cooling, and pH of the dispersion was measured again. The two pH values of before heating and after heating were recorded. If the pH after heating is higher than the pH before heating, it means that hydrolysis of the aluminum nitride proceeded.

Example 1

Preparation of Raw Aluminum Nitride Powder

α-Alumina having an average particle size of 1.2 μm, a specific surface area of 10.7 $m^2/g$ was used as an Al source. Carbon black having a specific surface area of 125 $m^2/g$ was used as a carbon powder. Yttrium oxide having an average particle size of 1.0 μm, a specific surface area of 11.7 $m^2/g$ was used as a rare earth metal compound (co-melting agent).

The α-alumina (100 parts by mass), 42 parts by mass of the carbon black, and 5.2 parts by mass of the yttrium oxide were mixed, and the resultant mixture was charged in a setter made of graphite.

Figure 3:
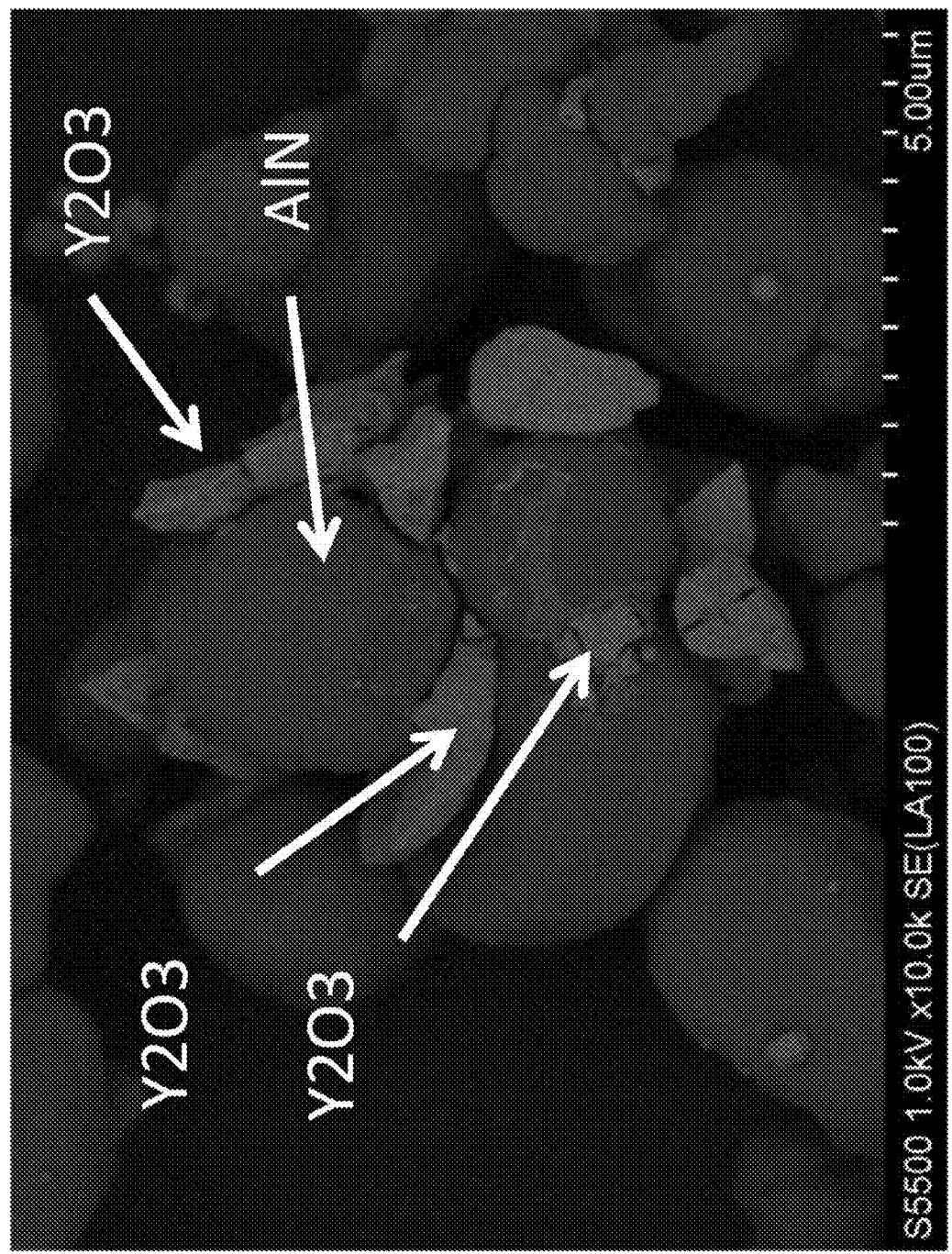
FIG. 3 is a scanning electron microscope (SEM) image of a raw material aluminum nitride powder particle prepared in Example 1.
Figure 4:
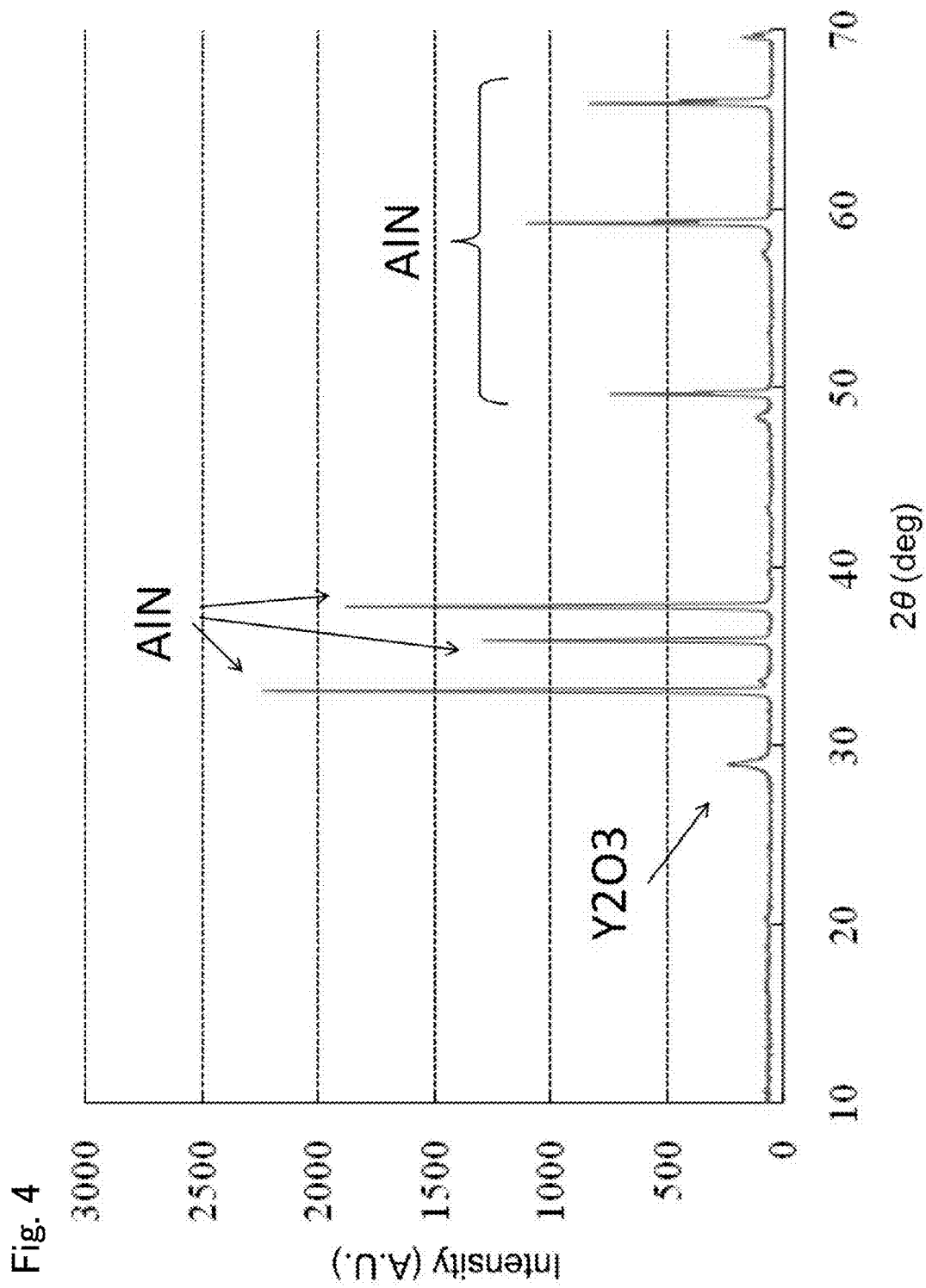
FIG. 4 is a result of powder X-ray diffraction of the raw material aluminum nitride powder particle prepared in Example 1.

Next, under nitrogen atmosphere, reductive nitriding was performed with firing temperature of 1700° C. and firing time of 15 hours, thereafter an oxidation treatment (decarbonization treatment) was carried out under air atmosphere at 700° C. for 12 hours to afford a raw material aluminum nitride powder. The average particle size of the obtained raw material aluminum nitride powder was 5 μm. The amount of yttria extracted with hydrochloric acid from the obtained raw material aluminum nitride powder was 5000 mg per 100 g of the raw material aluminum nitride powder. FIG. 3 shows a scanning electron microscope (SEM) image (reflected electron detection, accelerating voltage: 1.0 kV, ×10000 magnification) of the obtained raw material aluminum nitride powder. FIG. 4 shows the result of X-ray diffraction of the obtained raw material aluminum nitride powder and characterization of peaks. From FIGS. 3 and 4, it was confirmed that yttria existed on the particle surface.

(Acid Washing Step)

A contacting treatment with an acid solution was performed by putting the obtained raw material aluminum nitride powder (500 g) and 1 mol/L hydrochloric acid (1200 mL) in a 5 L beaker, and stirring by a stirrer at room temperature for 1 hour.

(Solid/Liquid Separation Step)

Next, the aluminum nitride powder was filtered from the acid solution by suction filtration, and washed by water, and thereafter the aluminum nitride powder was collected. The amount of yttria extracted with hydrochloric acid from the aluminum nitride powder after contacting with the acid solution was 200 mg per 100 g of the dried aluminum nitride powder after the acid washing.

(Phosphorus Acid Compound Treatment Step and Post-Treatment Step)

The aluminum nitride powder after contacting with the acid solution was dispersed in 0.6 L of 0.5 wt % aqueous orthophosphoric acid solution, and stirred by a stirring blade for 30 minutes. Thereafter the resultant dispersion was dried and solidified to afford a water-resistant aluminum nitride powder.

The water-resistance test was performed on the obtained water-resistant aluminum nitride powder. As a result, pH was 6.5 before heating and was 6.5 after heating, which showed that hydrolysis of the aluminum nitride did not proceed.

Example 2

A water-resistant aluminum nitride powder was produced in the same manner as in Example 1, except that the acid solution was changed to 1 mol/L nitric acid.

The amount of yttria extracted with hydrochloric acid from the aluminum nitride powder after contacting with the acid solution was 200 mg per 100 g of the dried aluminum nitride powder after the acid washing. Also, the result of the water-resistance test of the aluminum nitride powder after contacting with the phosphorus acid compound was pH=6.5 before heating and pH=6.5 after heating, which showed that hydrolysis of the aluminum nitride did not proceed.

Example 3

Acid Washing Step and Solid/Liquid Separation Step

The raw material aluminum nitride powder prepared in Example 1 (500 g) and 1 mol/L hydrochloric acid (1200 mL) were put in a 5 L beaker, and stirred by a stirrer at room temperature for 1 hour, then the resultant powder was collected by suction filtration and washed with water. The amount of yttria extracted with hydrochloric acid from the aluminum nitride powder after contacting with the acid solution was 200 mg per 100 g of the dried aluminum nitride powder after the acid washing.

(Oxide Film Formation Step)

The aluminum nitride powder after contact with the acid solution was subjected to an oxidation treatment under air atmosphere at 1000° C. for 5 hours. The amount of the oxide film on the particle surface of the aluminum nitride powder after the oxidation treatment was 0.02 g/m$^2$.

(Phosphorus Acid Compound Treatment Step and Post-Treatment Step)

The aluminum nitride powder after the oxidation treatment was dispersed in 4 wt % aqueous orthophosphoric acid solution (0.6 L) and stirred by a stirring blade for 30 minutes. The resultant dispersion was dried and solidified to afford a water-resistant aluminum nitride powder. The result of the water-resistance test was pH=6.5 before heating and pH=6.5 after heating, which showed that hydrolysis of the aluminum nitride powder did not proceed.

Comparative Example 1

The acid washing step was not carried out in Comparative Example 1. The raw material aluminum nitride powder prepared in Example 1 (500 g) and 0.5 wt % aqueous orthophosphoric acid solution (0.6 L) were put in a 5 L beaker, and stirred by a stirring blade for 30 minutes. The resultant dispersion was dried and solidified to try to afford a water-resistant aluminum nitride powder. As a result of the water-resistance test, pH was 6.5 before heating and was 11 after heating, which showed that hydrolysis of the aluminum nitride powder proceeded.

Comparative Example 2

A production of a water-resistant aluminum nitride powder was tried in the same manner as in Comparative Example 1, except that the concentration of the aqueous orthophosphoric acid solution was changed to 5 wt %. As a result of the water-resistance test, pH was 6.5 before heating and was 11 after heating, which showed that hydrolysis of the aluminum nitride proceeded.

Results of Examples 1 to 3 and Comparative Examples 1 and 2 are shown in Table 1.

TABLE 1

| | | Amount of $Y_2O_3$ extracted with hydrochloric acid (mg/100 gAlN powder) | | Amount of oxide film (g oxygen/m$^2$) | Phosphorus acid compound solution | Result of water-resistance test | |
|---|---|---|---|---|---|---|---|
| | Acid solution | before acid washing | after acid washing | | | pH before heating | pH after heating |
| Example 1 | 1 mol/L hydrochloric acid | 5000 | 200 | N.D. | 0.5 wt % aqueous orthophosphoric acid solution | 6.5 | 6.5 |

TABLE 1-continued

|  | Acid solution | Amount of $Y_2O_3$ extracted with hydrochloric acid (mg/100 gAlN powder) | | Amount of oxide film (g oxygen/$m^2$) | Phosphorus acid compound solution | Result of water-resistance test | |
|---|---|---|---|---|---|---|---|
|  |  | before acid washing | after acid washing |  |  | pH before heating | pH after heating |
| Example 2 | 1 mol/L hydrochloric acid | 5000 | 200 | N.D. | 0.5 wt % aqueous orthophosphoric acid solution | 6.5 | 6.5 |
| Example 3 | 1 mol/L hydrochloric acid | 5000 | 200 | 0.02 | 4 wt % aqueous orthophosphoric acid solution | 6.5 | 6.5 |
| Comparative example 1 | — | 5000 | — | N.D. | 0.5 wt % aqueous orthophosphoric acid solution | 6.5 | 11 |
| Comparative example 2 | — | 5000 | — | N.D. | 5 wt % aqueous orthophosphoric acid solution | 6.5 | 11 |

Example 4

A water-resistant aluminum nitride powder was produced in the same manner as in the Example 1, except that the stirring time in the acid washing step was changed to 0.5 hours. The amount of yttria extracted with hydrochloric acid from the aluminum nitride powder after contacting with the acid solution was 918 mg per 100 g of the dried aluminum nitride powder after the acid washing. The result of the water-resistance test of the obtained water-resistant aluminum nitride is shown in Table 2.

Comparative Examples 3 to 5

Three aluminum nitride powders each having an amount of yttria extracted with hydrochloric acid outside the range of the present invention (more than 1000 mg per 100 g of powder) were prepared by changing the raw material aluminum nitride powder and the conditions of the acid washing. Each of the three aluminum nitride powders was subjected to the phosphorus acid compound treatment in the same manner as in Example 1 to try to afford a water-resistant aluminum nitride powder. Results of the water-resistance test of each powder are shown in Table 2.

TABLE 2

|  | Amount of $Y_2O_3$ extracted with hydrochloric acid (mg/100 gAlN powder) before phosphorus acid compound treatment | Phosphorus acid compound solution | Result of water-resistance test | |
|---|---|---|---|---|
|  |  |  | pH before heating | pH after heating |
| Example 4 | 918 | 0.5 wt % aqueous orthophosphoric acid solution | 6.5 | 6.5 |
| Comparative example 3 | 4362 | 0.5 wt % aqueous orthophosphoric acid solution | 6.5 | 11 |
| Comparative example 4 | 5262 | 0.5 wt % aqueous orthophosphoric acid solution | 6.5 | 11 |
| Comparative example 5 | 26879 | 0.5 wt % aqueous orthophosphoric acid solution | 6.5 | 11 |

In the water-resistance test, the water-resistant aluminum nitride powder of Example 4 whose amount of yttria extracted with hydrochloric acid from the aluminum nitride powder after contacting with the acid solution was within the range of the present invention showed pH=6.5 before heating and pH=6.5 after heating, which showed that hydrolysis of the aluminum nitride did not proceed. On the other hand, each water-resistant aluminum nitride powder of Comparative Examples 3 to 5 obtained by the phosphorus acid compound treatment of the aluminum nitride powder whose amount of yttria extracted with hydrochloric acid was outside of the range of the present invention showed pH=6.5 before heating and pH=11 after heating in the water-resistance test, which showed that hydrolysis of the aluminum nitride proceeded.

The invention claimed is:

1. A method for producing a water-resistant aluminum nitride powder by surface treatment of aluminum nitride powder particles having yttria on a surface thereof as a result of a production process thereof, the method comprising the successive steps of:
    (i) making an aluminum nitride powder contact with an acid solution which can dissolve yttria, wherein yttria exists at least on a particle surface of the aluminum nitride powder;
    (ii) removing the acid from the aluminum nitride powder; and
    (iii) making the aluminum nitride powder contact with a phosphorus acid compound,
    wherein an amount of yttria which remains on the surface of the aluminum nitride powder after the step (i) is determined by carrying out the following successive steps of (a) to (e) on the aluminum nitride powder filtered, washed with water, and dried after the step (i) and is no more than 1000 mg per 100 g of the aluminum nitride powder filtered, washed with water, and dried:
    (a) adding 10 g of the aluminum nitride powder filtered, washed with water, and dried to 25 mL of 1 mol/L hydrochloric acid in a 50 mL vial bottle at 25° C.;
    (b) holding the vial bottle in a ultrasonic bath and sonicating the vial bottle at 43 kHz for 30 minutes at 25° C.;
    (c) filtering the content of the vial bottle and thereby obtaining a filtrate;
    (d) measuring yttrium content in the filtrate by means of inductively coupled plasma atomic emission spectrometry; and
    (e) converting the yttrium content in the filtrate into the content in terms of yttria.

2. The method for producing the water-resistant aluminum nitride powder according to claim 1,
    wherein the average particle size of the aluminum nitride powder is 1 to 30 μm.

3. The method for producing the water-resistant aluminum nitride powder according to claim 1,
   wherein the solvent of the acid solution is water; and the acid solution has pH of 4 or less.

4. The method for producing the water-resistant aluminum nitride powder according to claim 1,
   wherein the phosphorus acid compound is one or more selected from the group consisting of: inorganic phosphoric acids and metal salts thereof, and organic phosphorus acid having an organic group.

5. The method for producing the water-resistant aluminum nitride powder according to claim 1,
   wherein in the step (ii), mass of deposit of the phosphorus acid compound per unit surface area of the aluminum nitride powder is 0.5 to 50 mg/m$^2$ in terms of orthophosphate ion ($PO_4^{3-}$).

6. The method for producing the water-resistant aluminum nitride powder according to claim 1,
   wherein the acid solution which can dissolve yttria is a solution of an acid other than phosphorus acid compounds.

7. The method for producing the water-resistant aluminum nitride powder according to claim 1,
   wherein the acid solution which can dissolve yttria is a solution of no less than 0.1 mol/L of one or more acid selected from a group consisting of hydrogen chloride, nitric acid, sulfuric acid, perchloric acid, hydrogen iodide, hydrogen bromide, permanganic acid, and thiocyanic acid.

8. The method for producing the water-resistant aluminum nitride powder according to claim 1,
   wherein the aluminum nitride powder employed in the step (i) is an aluminum nitride powder obtainable by firing a mixed powder comprising alumina or alumina hydrate, a carbon powder, and yttria, under nitrogen atmosphere.

* * * * *